United States Patent [19]
Sugawara et al.

[11] Patent Number: 4,958,323
[45] Date of Patent: Sep. 18, 1990

[54] SEMICONDUCTOR FILE MEMORY

[75] Inventors: Ken Sugawara, Ibaraki; Katsujiro Nakamura, Toride; Mikio Matoba, Ibaraki; Shigeru Sakairi, Tsukuba, all of Japan

[73] Assignee: Hitachi Maxell, Ltd., Osaka, Japan

[21] Appl. No.: 243,837

[22] Filed: Sep. 13, 1988

[30] Foreign Application Priority Data

Sep. 14, 1987 [JP] Japan .................. 62-230070

[51] Int. Cl.$^5$ ............................................ G11C 13/00
[52] U.S. Cl. .......................... 365/189.01; 365/189.02; 365/230.01; 365/230.03
[58] Field of Search ............... 365/189.01, 189.02, 365/230.01, 230.02, 230.03

[56] References Cited

U.S. PATENT DOCUMENTS 4,604,653  5/1986  Shimizu .................. 364/518

Primary Examiner—Terrell W. Fears

[57] ABSTRACT

A semiconductor file memory, intended for use as an external memory of an information processor such as an arithmetic processor, including an interface for transacting data with the information processor, a plurality of memory units each including semiconductor memory devices mounted on a substrate and having identical terminal assignments in connection commonly to a bus of the interface through a connector, a control circuit unit having identical terminal assignments for the connectors of the memory units and operating to control the memory units by taking the place of at least one of the memory units, and a selection circuit for selecting a memory unit or control circuit unit out of the memory units and the control unit which has taken the place of the memory unit in response to signal from the interface.

5 Claims, 2 Drawing Sheets

SEMICONDUCTOR FILE MEMORY

BACKGROUND OF THE INVENTION

This invention relates to a semiconductor file memory (will be termed simply "file memory" hereinafter), and more particularly to a file memory capable of setting functions selectively after manufacture.

Conventional file memories have their functions designed to meet individual specifications, and the alteration of functions or specifications after manufacturing is not assumed. Therefore, it is not possible for one file memory to be used for different functions or specifications, but the file memory must be redesigned to meet additional requirements.

SUMMARY OF THE INVENTION

This invention is intended to overcome the foregoing prior art deficiency, and its prime object is to provide a file memory capable of setting functions or specifications selectively after manufacture.

In order to achieve the above objective, the inventive file memory comprises an interface for transacting data with an information processor, a plurality of memory units each including semiconductor memory devices mounted on a substrate and having a same terminal assignment in connection commonly to the bus of the interface through a connector, a control circuit unit having the same terminal assignment for the connectors of the memory units and operating to control the memory units by taking the place of at least one of the memory units, and a selection circuit for selecting a memory unit or control circuit unit out of the memory units and the control circuit unit which has taken the place of the memory unit in response to a signal from the interface.

The provision of compatibility of connection with the memory units allows the control circuit unit to be selected in the same operational manner of selecting a memory unit for implementing the control operation, and accordingly by replacing arbitrarily one of memory units to meet a specific function, the file memory can be converted to include the specific function by merely modifying the software. Consequently, various functions or specifications can be set for the file memory by merely replacing a memory unit with a control circuit unit for the relevant control, instead of changing the hardware design.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

An embodiment of this invention will be described in detail with reference to the drawings.

Figure 1:
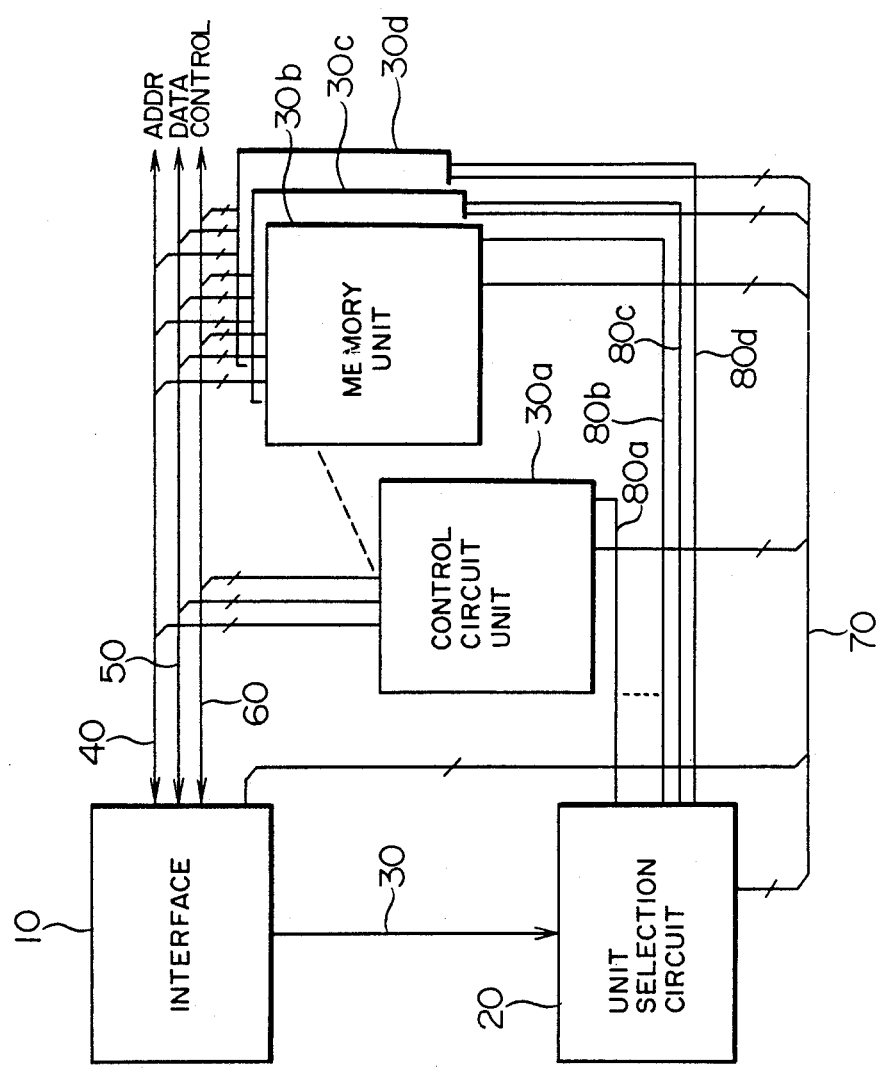
FIG. 1 is a block diagram showing the principle of the file memory embodying the present invention.
Figure 2:
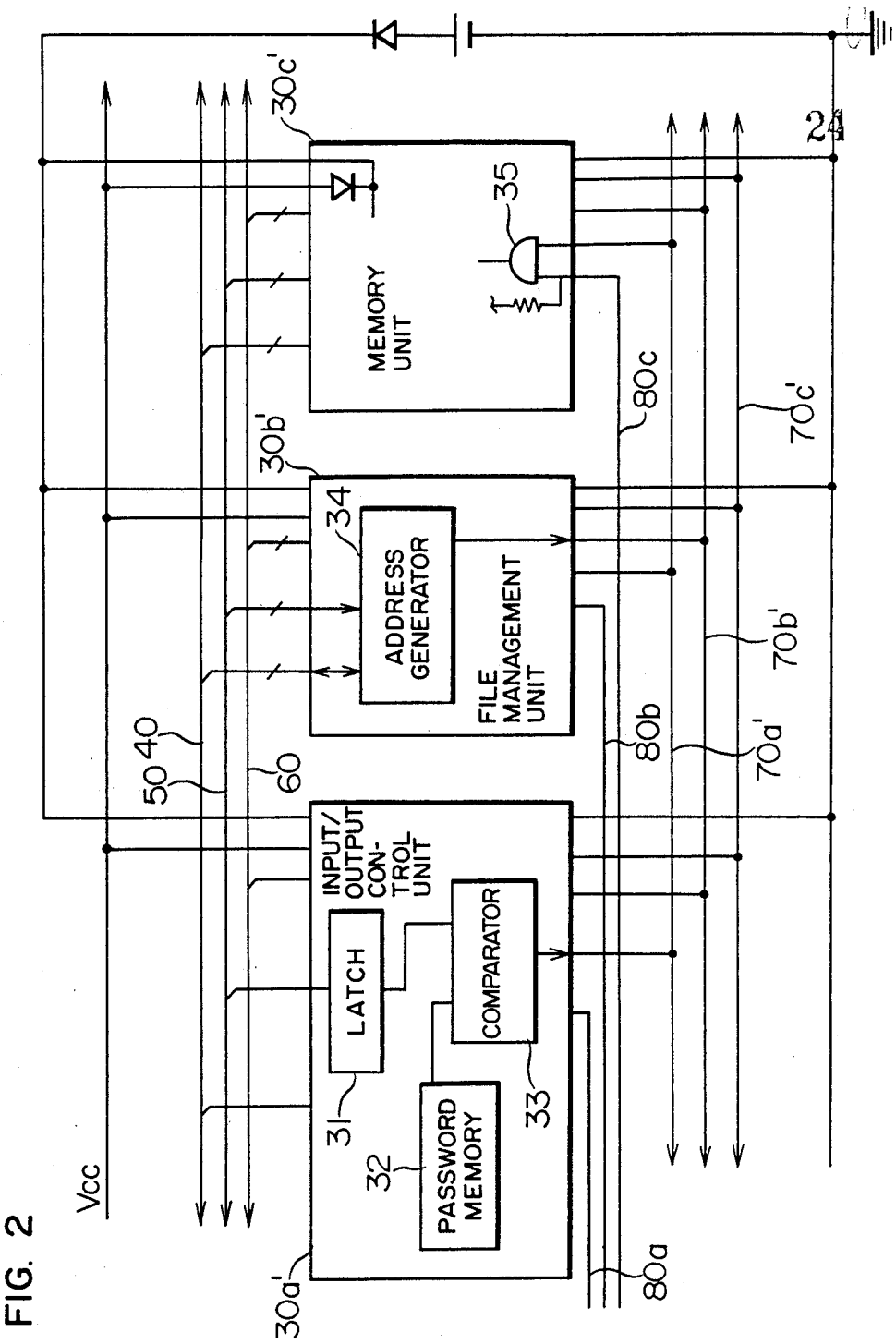
FIG. 2 is a block diagram showing in more detail, as an example, the inventive file memory.

FIG. 1 is a block diagram showing the principle of the inventive file memory, and FIG. 2 is a block diagram showing the file memory in more detail. In FIG. 1, indicated by 10 is an interface with an external system such as a host computer, 30a is a control circuit unit which is connected in place of one of the memory units, and 30b, 30c and 30d are memory units each made up of semiconductor memory devices mounted on a circuit board.

The control circuit unit 30a and memory units 30b, 30c and 30d are connected in interchangeable fashion through connectors to an address bus 40, data bus 50 and control bus 60, so that they are connected commonly to the interface 10. The memory units 30b, 30c and 30d and control circuit unit 30a are each fabricated on a circuit board having compatibility of connection with one another to the buses so that they can be replaced with each other.

Consequently, each memory unit can have identical circuit arrangements, the memory capacity can readily be altered by changing the number of units, and even more than one control circuit unit can be fitted in place of memory units in accordance with the functions or specifications to be offered.

The address bus 40 carries the low-order address bits of each memory unit, and the high-order address bits are placed on address lines 30. Indicated by 20 is a unit selection circuit for selecting any of the memory units 30b, 30c and 30d and control circuit unit 30a. The selection circuit 20 including a decoder, etc. decodes the address signal provided on the signal lines 30 by the interface 10 to produce a selection signal, and also receives the control signal on the unit connection bus 70 and decodes the signal to produce a selection signal. Namely, the unit selection circuit 20 produces unit enable signals equal in number to the memory units 30b, 30c and 30d and control circuit unit 30a, and sends one of the enable signals, activated as a result of decoding, over the unit selection signal line 80a, 80b, 80c or 80d.

The unit connection bus 70 is to make a mutual connection among the units, unit selection circuit 20 and interface 10, and it transmits the control signal from one unit to the other unit, to the unit selection circuit 20, or to the interface 10.

FIG. 2 shows in more detail the control circuit unit 30a and some other sections of the inventive file memory, in which two of the memory units are replaced with a control circuit unit for password-based input/output control and a control circuit unit for file management. Indicated by 30a' is the input/output control unit which includes a latch circuit 31 for holding a password, an internal memory 32 for storing passwords, and a comparison circuit 33. Indicated by 30b' is the file management unit, and 30c' is a memory unit. It should be noted that the file memory actually includes more memory units, but they are represented by the memory unit 30c'.

In response to the issuance of the unit selection signal (high-order address) for the input/output control unit 30a' to the unit selection circuit 20 from the outside by way of the interface 10 and upper address signal lines 30, the selection signal for the input/output control unit 30a' is enabled, and the password which is placed on the data bus 50 by the interface 10 is held in the latch 31 of the input/output control unit 30a'. The internal memory (EEPROM) 32 has a record of preset passwords, and the comparison circuit 33 compares the password in the latch with the passwords (data) in the internal memory 32. Only if a matching result of comparison has been reached, a match detect output signal is produced to cause a unit connection signal line 70a' in the unit connection bus 70 to go high.

The high output signal on the unit connection signal line 70a' is delivered to the memory unit 30c'. The memory unit 30c' has an AND gate 35 for taking a logical product between the unit selection signal 80c and the signal on the unit connection signal line 70a'. In case of selecting the memory unit 30c' following the above-mentioned matching detection, the AND gate 35 takes a logical product between the high unit selection signal 80c provided by the interface 10 and the signal on the unit connection signal line 70a', and the resulting output enables the access to the memory unit 30c'. Consequently, the memory unit 30c' is accessed with the address data placed on the address bus 40.

The latch 31 is cleared by the reset signal or when the power is turned on, and after that the unit connection signal line 70a' stays low until the next password is entered, disabling the access to the memory unit 30c'. The internal memory of the memory unit 30c is a battery backed-up RAM or an EEPROM or ROM, and it ever retains data including the passwords. The use of an EEPROM for the internal memory 32 enables the user to rewrite the memory contents.

The file management unit 30b incorporates an address conversion circuit 34, which is enabled by the unit selection signal 80b' from the outside to receive the file name, etc. sent from the interface 10 by way of the address bus 40 and data bus 50, and, upon reception, generates the address of a memory unit in which data is to be stored and places a control signal on the unit connection signal line 70b'. The control signal is sent to the interface over the unit connection signal line 70b', which then makes the address bus assume a high-impedance, places the converted memory address data on the address bus 40, and generates the address of the memory unit. The interface 10 further sends a signal to the unit selection circuit 20 over the unit connection signal line 70c', and causes the memory unit selection signal on the unit connection signal line 80c' to go high. Consequently, the memory unit 30c is selected, and its address is specified by the address data on the address bus 40.

As described above, this invention enables the memory units and control unit to have the signal compatibility, whereby the function and memory capacity can easily be altered. It is of course possible for the file memory to have all its units designated as memory units. The concept of file memory includes a memory cartridge or the like which incorporates multiple memory boards.

As will be appreciated from the above description, the inventive file memory has compatibility of connection between control circuit units and memory units so that a control circuit unit is selected for a control operation in the same manner as selecting a memory unit, and therefore by replacing any of the memory units depending on a specific function, the file memory can be converted to have the specific function by merely modifying the software. Consequently, various functions or specifications can be set after manufacture for the file memory by merely replacing a memory unit with the control circuit unit which implements the relevant control, instead of changing the hardware design.

The invention being thus described, it will be obvious that the same may be varied i many ways. Such variations are not to be regarded as a departure from the spirit and scope of the invention, and all such modifications as would be obvious to one skilled in the art are intended to be included within the scope of the following claims.

We claim:

1. A semiconductor file memory, used as an external memory for an information processor such as an arithmetic processor, comprising:
   interface means for transacting data with said information processor;
   a plurality of memory units each including semiconductor memory devices mounted on a substrate and having identical terminal assignments in connection commonly to a bus of said interface means through a connector;
   a control circuit unit having identical terminal assignments as said connectors of said memory units and operating to control said memory units by taking the place of at least one of said memory units; and
   a selection circuit for selecting one of said memory units or said control circuit unit which has taken the place of a memory unit in response to a signal from said interface means.

2. A semiconductor file memory according to claim 1, wherein said selection circuit comprises a decoder which decodes an address signal on high-order address signal lines of said bus of said interface means to produce a selection signal and which decodes a control signal on a unit connection bus for connecting said memory units to produce a selection signal.

3. A semiconductor file memory according to claim 1, wherein said memory units comprise battery backed-up RAMs.

4. A semiconductor file memory according to claim 1, wherein said memory units comprise EEPROMs.

5. A semiconductor file memory according to claim 1 further comprising an input/output control unit which includes a latch circuit for holding a password entered from outside, an internal memory for storing a password, and a comparison circuit for comparing said password held in said latch circuit with said password stored in said internal memory and producing an equality or inequality signal, said memory units being enabled for access only when said comparison circuit has produced said equality signal.

* * * * *